(12) United States Patent
Nagae et al.

(10) Patent No.: US 7,060,984 B2
(45) Date of Patent: Jun. 13, 2006

(54) MULTI-CHARGED BEAM LENS AND CHARGED BEAM EXPOSURE APPARATUS USING THE SAME

(75) Inventors: Kenichi Nagae, Kanagawa (JP); Haruhito Ono, Kanagawa (JP); Sayaka Tanimoto, Tokyo (JP)

(73) Assignees: Canon Kabushiki Kaisha, Tokyo (JP); Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 10/902,789

(22) Filed: Aug. 2, 2004

(65) Prior Publication Data
US 2005/0077475 A1 Apr. 14, 2005

(30) Foreign Application Priority Data
Aug. 6, 2003 (JP) .............................. 2003-287487

(51) Int. Cl.
*H01J 3/14* (2006.01)
(52) U.S. Cl. ............................ 250/396 R; 250/491.11; 430/296
(58) Field of Classification Search ............ 250/396 R, 250/491.11; 430/296
See application file for complete search history.

(56) References Cited

U.S. PATENT DOCUMENTS

| | | | |
|---|---|---|---|
| 6,335,127 B1 | 1/2002 | Ono | ............................ 430/5 |
| 6,559,463 B1 | 5/2003 | Ono et al. | ............. 250/492.22 |
| 6,603,128 B1 | 8/2003 | Maehara et al. | ........ 250/441.11 |
| 6,617,587 B1 * | 9/2003 | Parker et al. | ................ 250/398 |
| 6,617,595 B1 * | 9/2003 | Okunuki | ................ 250/492.22 |
| 6,872,950 B1 * | 3/2005 | Shimada et al. | ......... 250/396 R |
| 2001/0052576 A1 | 12/2001 | Shimada et al. | ......... 250/492.1 |
| 2001/0054690 A1 | 12/2001 | Shimada et al. | ............. 250/306 |
| 2002/0000766 A1 | 1/2002 | Ono et al. | .................. 313/240 |
| 2002/0005491 A1 | 1/2002 | Yagi et al. | ........... 250/396 ML |

OTHER PUBLICATIONS

Feinerman, A.D., et al. "Sub-centimeter micromachined elecron microscope," *J. Vac. Sci Technol.*, A 10(4), Jul./Aug. 1992, pp. 611-616.

Lee, K.Y., et al. "High aspect ratio aligned multilayer microstructure fabrication," *J. Vac. Sci. Technol.*, B 12(6), Nov./Dec. 1994, pp. 3, 3425-3430.

Sasaki, T. "A multibeam scheme for electron-beam lithography," *J. Vac. Sci. Technol.*, 19(4), Nov./Dec. 1981. pp. 963-965.

* cited by examiner

*Primary Examiner*—Nikita Wells
*Assistant Examiner*—Zia R. Hashmi
(74) *Attorney, Agent, or Firm*—Fitzpatrick, Cella, Harper & Scinto

(57) ABSTRACT

A multi-charged beam lens formed by stacking, via insulators, at least three substrates each having a plurality of apertures which pass charged beams. The lens includes a voltage application portion arranged on at least one of the at least three substrates. The voltage application portion and the insulators are connected via an insulating portion consisting of an oxide material in order to achieve electrical isolation between the voltage application portion and the insulators.

16 Claims, 10 Drawing Sheets

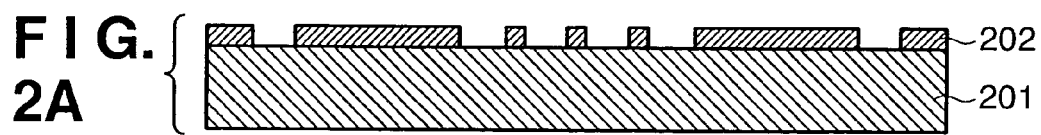
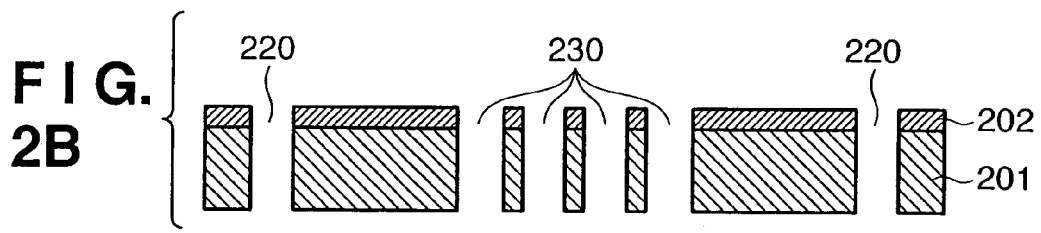
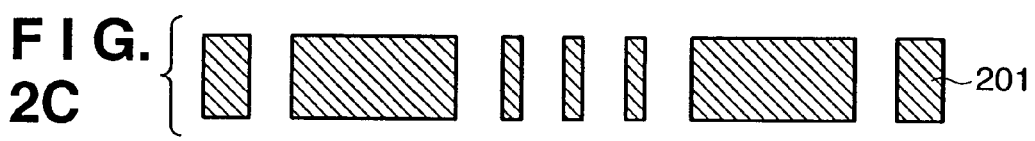
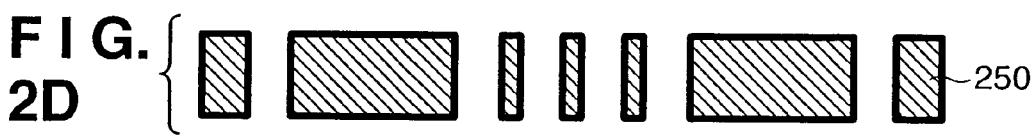
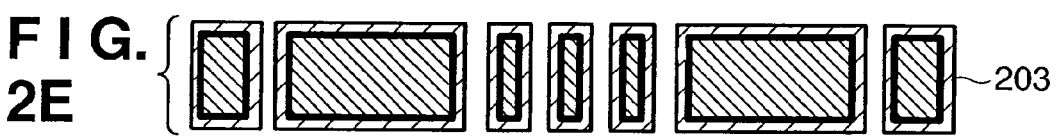
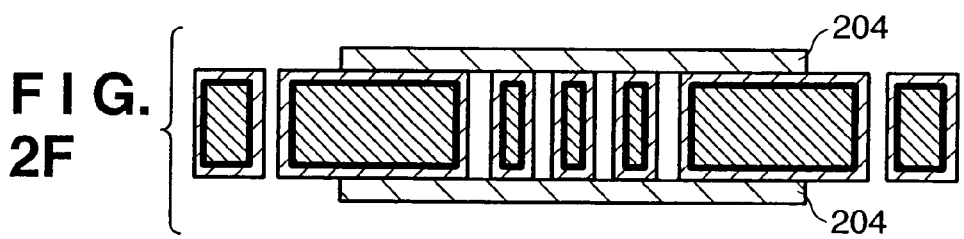
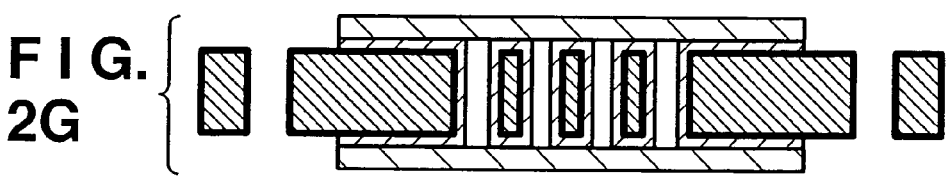
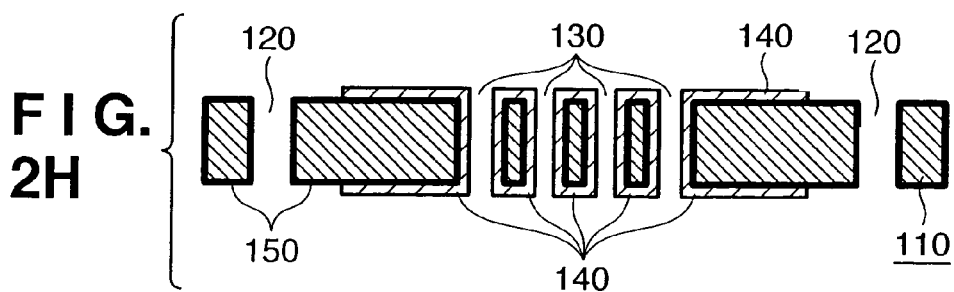

MULTI-CHARGED BEAM LENS AND CHARGED BEAM EXPOSURE APPARATUS USING THE SAME

CLAIM OF PRIORITY

This application claims priority from Japanese Patent Application No. 2003-287487 filed on Aug. 6, 2003, which is hereby incorporated by reference herein.

FIELD OF THE INVENTION

The present invention relates to a charged beam exposure apparatus such as an electron beam exposure apparatus or an ion beam exposure apparatus used to expose a microdevice such as a semiconductor integrated circuit and, more particularly, to a charged beam exposure apparatus which performs exposure to a pattern using a plurality of charged particle beams and a multi-charged beam lens for use in the apparatus.

BACKGROUND OF THE INVENTION

In the production of a microdevice such as a semiconductor device, a multi-charged beam exposure system for performing exposure to a pattern simultaneously with a plurality of charged beams without using any mask has been proposed.

In a multi-charged beam exposure apparatus using this system, the number of charged beams depends on the number of lenses in a multi-charged beam lens, and the number of lenses is a main factor which determines the throughput. Accordingly, how to improve the lens performance while downsizing the lens and increasing the density is one of the important factors for improving the performance of the multi-charged beam exposure apparatus.

Electron lenses are classified into electromagnetic and electrostatic types. The electrostatic electron lens does not require any coil core, or the like, and is simpler in structure and more advantageous to downsizing than the electromagnetic electron lens. Typical prior art concerning the electrostatic electron lens (electrostatic lens) will be described below.

A. D. Feinerman, et al. (J. Vac. Sci. Technol. A10(4), p. 611, 1992) disloses a method of anodically bonding a fiber and a V-groove formed by Si crystal anisotropic etching of an electrode fabricated by a micromechanical technique, thereby forming a three-dimensional structure from three electrodes serving as single electrostatic lenses. The Si film has a membrane frame, a membrane, and an aperture which is formed in the membrane and transmits and electron beam.

K. Y. Lee, et al. (J. Vac. Sci. Technol. B12(6), p. 3,245, 1994) discloses a structure obtained by bonding Si layers and Pyrex glass layers by using anodic bonding. This technique fabricates aligned microcolumn electron lenses.

Sasaki (J. Vac. Sci. Technol. 19, p. 963, 1981) discloses an arrangement in which three electrodes having lens aperture arrays are arranged into an Einzel lens. In an electrostatic lens having this arrangement, a voltage is generally applied to the central one of three electrodes, and the remaining two lenses are grounded, obtaining lens action.

However, a conventional electrostatic electron lens, which is formed by alternately stacking insulators and electrodes, has the following problems. More specifically, the electrodes serve as back electrodes for the insulators. Also, field electron emission at the triple point of the boundary between each insulator, vacuum region, and electrode may cause generation of electrons, or a secondary electron avalanche phenomenon may occur on the surface of any insulator. If this occurs, surface discharge is likely to occur on the surface of the insulator. This surface discharge may decrease the operating voltage or operational reliability of the electron lens.

SUMMARY OF THE INVENTION

The present invention has been made in consideration of the above-mentioned background, and has as its object to provide a multi-charged beam lens which is more resistant to surface discharge and has high performance and reliability.

To achieve the above-mentioned object, according to the present invention, there is provided a multi-charged beam lens formed by stacking via insulators at least three substrates each having a plurality of apertures which pass charged beams, characterized in that at least one of the at least three substrates comprises a voltage application portion and an insulating portion, and the insulating portion is arranged between the voltage application portion and a portion of the substrate that is in contact with the insulator. The insulating portion may extend to the portion that is in contact with the insulator.

According to the present invention, an insulating portion is arranged between the voltage application portion of the substrate and a portion of the substrate that is in contact with an inter-substance insulator. With this arrangement, the voltage application portion and insulator can electrically be separated (insulated) from each other, and the above-mentioned triple point can be reduced or eliminated. Also, the present invention does not have a back electrode arrangement. This makes it possible to reduce surface discharge which may occur on the surface of each insulator and provide a multi-charged beam lens with a high breakdown voltage, high performance, and high reliability. Use of this multi-charged beam lens in a charged beam exposure apparatus makes it possible to provide a reliable exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 2A to 2H are views for explaining a method of fabricating each of electrode substrates which constitute the multi-charged beam lens in FIG. 1;

DETAILED DESCRIPTION OF THE PREFERRED EMBODIMENTS

Preferred embodiments according to the present invention will be described below with reference to the drawings.

First Embodiment

Figure 1:
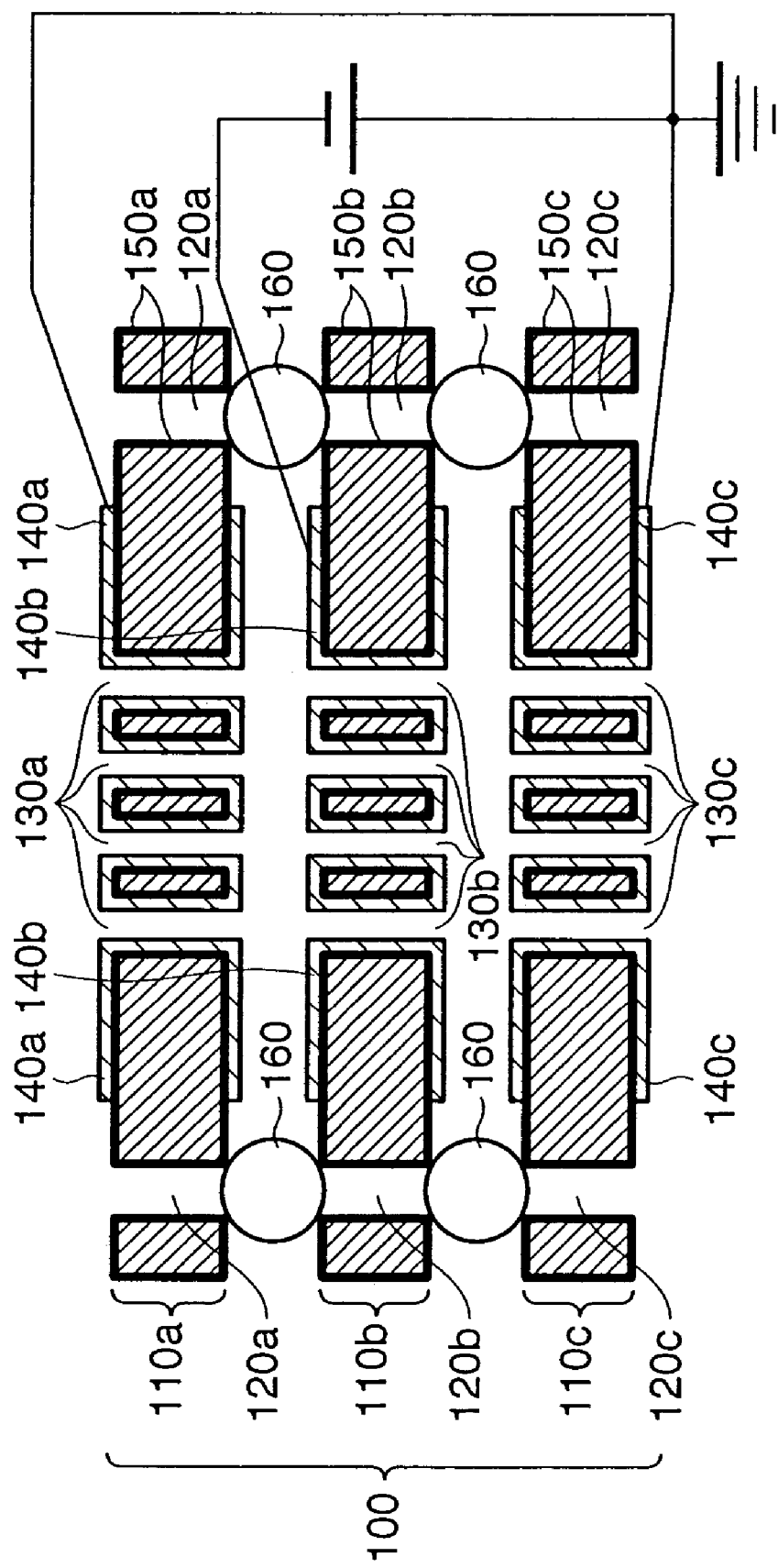
FIG. 1 is a view for explaining the structure of a multi-charged beam lens according to the first embodiment of the present invention.

FIG. 1 is a sectional view schematically showing the structure of a multi-charged beam lens according to the first embodiment of the present invention. A multi-charged beam lens 100 has a structure in which three electrode substrates 110a, 110b, and 110c are arranged via insulators (spacers) 160. The three electrode substrates 110a, 110b, and 10c have lens apertures 130a, 130b, and 130c, voltage application portions (electrode portions) 140a, 140b, and 140c, which control a trajectory of charged beams passing through the lens apertures 130a, 130b, and 130c, insulating portions 150a, 150b, and 150c, and assembly grooves 120a, 120b, and 120c. The insulators 160 are interposed between the grooves 120a, 120b, and 120c, positioning the three electrode substrates 110a, 110b, and 10c.

The electrode substrates 110a to 110c may be made of a conductor or semiconductor. Use of silicon as the material for the electrode substrates 110a to 110c makes it possible to perform reactive ion etching or wet etching using a strong alkali and to facilitate the processing. The grooves 120a to 120c do not always extend through the substrates, and their surfaces may partially be recessed. The voltage application portions 140a to 140c can be formed by various methods such as CVD and sputtering and can be formed with ease. It is preferable to use a noble metal as the material for the voltage application portions 140a to 140c. This is because the noble metal resists oxidation and can last for a long time. The insulating portions 150a to 150c are formed on the surfaces of the electrode substrates 110a to 110c. It is preferable to use silicon dioxide as the material for the insulating portions 150a to 150c. This is because the silicon dioxide can easily be formed on the surfaces of the electrode substrates 110a to 110c by various film formation means such as CVD and sputtering. The shape of each insulator 160 is not limited to any specific one. To easily assemble the multi-charged beam lens while positioning it at high precision, the shape is preferably cylindrical. In this embodiment, out of the voltage application portion 140a of the upper electrode substrate, the voltage application portion 140b of the intermediate electrode substrate, and the voltage application portion 140c of the lower electrode substrate, the upper electrode substrate voltage application portion 140a and the lower substrate voltage application portion 140c receive the same potential and are typically grounded.

At this time, portions (in this case, the edge portions of the grooves 120a, 120b, and 120c) where the electrode substrates are in contact with the insulators 160 between the electrode substrates and the voltage application portions 140a, 140b, and 140c, serving as electrodes, are separated from each other via the insulating portions 150a, 150b, and 150c formed on the surfaces of the electrode substrates. Accordingly, surface discharge, which may occur on the surface of each insulator 160, can be reduced.

As shown in FIG. 1, the voltage application portion 140b of the intermediate electrode substrate typically receives a negative potential with respect to the potential of the voltage application portion 140a of the upper electrode substrate and the voltage application portion 140c of the lower electrode substrate. However, the voltage application portion 140b may receive a positive potential.

In this embodiment, the multi-charged beam lens 100 comprises three electrode substrates. However, the number of electrode substrates is not limited to three and can arbitrarily be set.

An example of a method of fabricating the electrode substrates 110a, 110b, and 110c shown in FIG. 1 will be described with reference to FIGS. 2A to 2H. In the step shown in FIG. 2A, a silicon wafer 201 is prepared, and a resist is applied to the surface of the silicon wafer 201 by spin coating or the like. After that, the wafer is patterned in the exposure and developing steps, forming a mask 202. In the step shown in FIG. 2B, lens apertures 230 and an assembly groove 220 are formed by dry etching (anisotropic etching) using etching gas such as $SF_6$ gas. Thereafter, the mask 202 is removed in the step shown in FIG. 2C. In the step shown in FIG. 2D, an insulating layer 250 of silicon dioxide is formed on the surface of the silicon wafer 201 by thermal oxidation.

In the step shown in FIG. 2E, a conductive material is sputtered to at least the inner wall of each lens aperture 230 of the silicon wafer 201 and its periphery, and preferably the entire surface (including the inner wall of the lens aperture 230) of the silicon wafer 201, forming a conductive film 203. As the conductive material for the conductive film 203, a metal is preferably used. A noble metal which resists oxidation is more preferable, and gold is most preferable. In the step shown in FIG. 2F, resist is applied to the upper and lower surfaces of the silicon wafer by spin coating or the like. After that, the resist is patterned in the exposure and developing steps, forming a mask 204. In the step shown in FIG. 2G, the conductive film 203 is etched by reactive ion etching using chlorine, argon, or the like. Thereafter, in the step shown in FIG. 2H, the mask 204 is removed. An electrode substrate 110, which has the voltage application portion 140, lens apertures 130, assembly grooves 120, and insulating portion 150, is obtained.

The insulator 160 (FIG. 1) is arranged in the assembly groove 120 of the electrode substrate 110 obtained in the above-mentioned steps. Another electrode substrate 110 is stacked thereon. In this manner, the multi-charged beam lens 100 shown in FIG. 1 can be obtained.

If the multi-charged beam lens is constituted by four or more electrode substrates as well, the multi-charged beam lens can be fabricated using the same method as described above.

In the schematic sectional view shown in FIG. 1, four electron lenses each comprising the four lens apertures 130a, 130b, or 130c are illustrated. Electron lenses can be arranged in accordance with a one- or two-dimensional design specification. In a typical multi-charged beam lens, several hundred or several thousand electron lenses can be two-dimensionally arranged.

An electron beam exposure apparatus (drawing apparatus) using a multi-charged beam lens, which can be manufactured by the above-mentioned method, will be described. The following example will describe an exposure apparatus which adopts an electron beam as a charged beam. The present invention can also be applied to an exposure apparatus using another type of beam, such as an ion beam, as a charged beam.

Figure 3A:
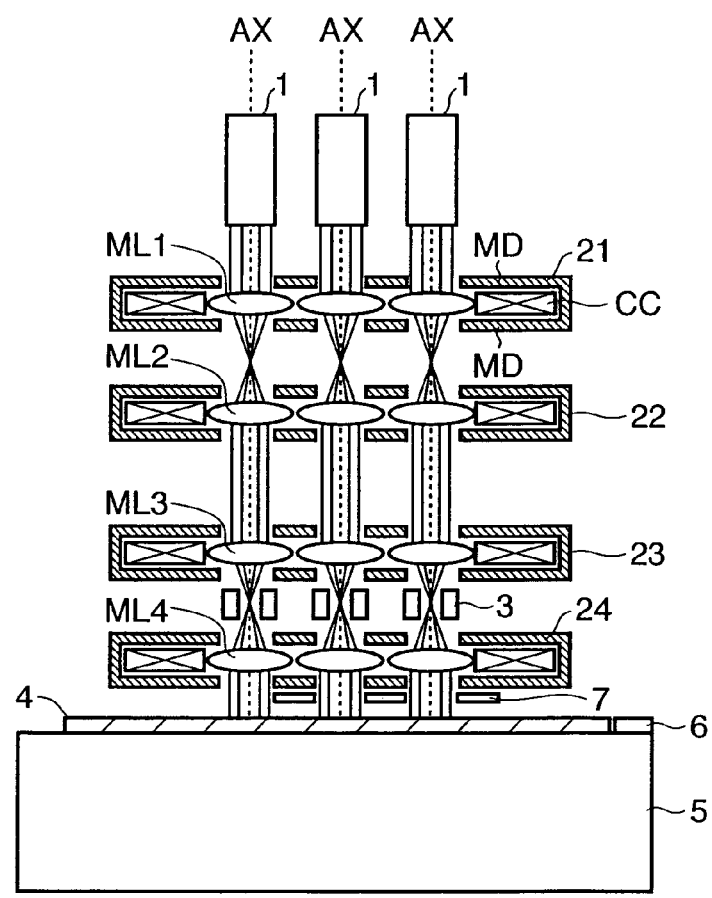
FIGS. 3A and 3B are views schematically showing the main part of an electron beam exposure apparatus which uses the lens in FIG. 1.
Figure 3B:
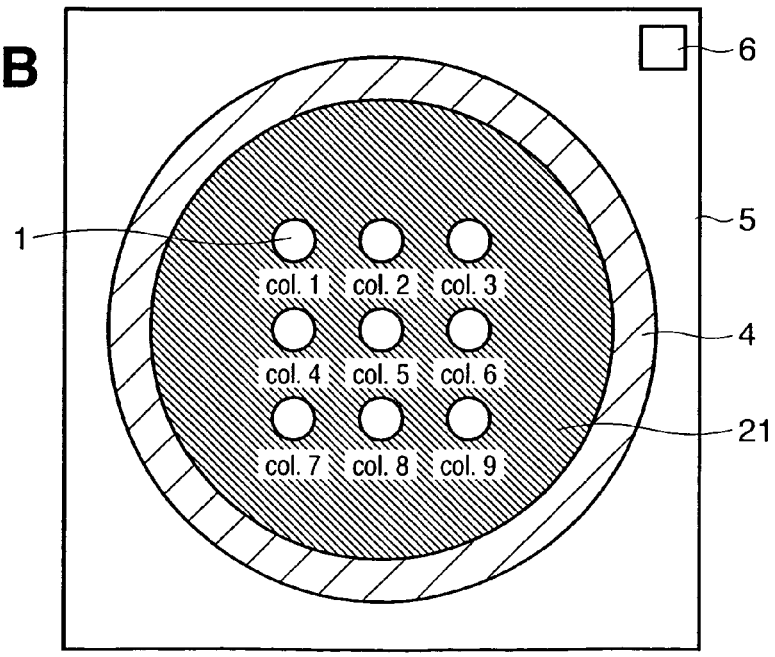

FIGS. 3A and 3B are views schematically showing the main part of an electron beam exposure apparatus using a multi-charged beam lens which can be manufactured by the present invention. In FIG. 3A, reference numeral 1 denotes multi-source modules each of which forms a plurality of electron images and emits electron beams from the electron images. As shown in FIG. 3B, 3×3 multi-source modules 1 are arrayed. The multi-source module 1 will be described later in detail.

As shown in FIG. 3A, reference numerals 21, 22, 23 and 24 denote magnetic lens arrays. In each magnetic lens array, magnetic disks MD each have 3×3 openings having the same shape and are vertically arranged with a spacing between them. The magnetic lens arrays are excited by common coils CC. As a consequence, each aperture functions as the magnetic pole of one of magnetic field lenses ML, and a lens magnetic field is generated.

A plurality of electron source images of each multi-source module 1 are projected onto a wafer 4 by four magnetic lenses (ML1, ML2, ML3, and ML4) corresponding to the magnetic lens arrays 21, 22, 23, and 24, respectively. An optical system which acts on electron beams emitted from one multi-source module before the wafer is irradiated with the electron beams is defined as a column hereinafter. That is, in this embodiment, the optical system of the electron beam exposure apparatus has nine columns (col. 1 to col. 9), as shown in FIG. 3B.

An image is once formed by the two corresponding magnetic lenses of the magnetic lens arrays 21 and 22, and then projected onto the wafer 4 by the two corresponding magnetic lenses of the magnetic lens arrays 23 and 24. By individually controlling the excitation conditions of the magnetic lens arrays 21, 22, 23, and 24 by the common coils, the optical characteristics (focal position, image rotation, and magnification) of each column can be adjusted to be substantially uniform (i.e., by the same amount).

Reference numeral 3 denotes main deflectors. The main deflectors 3 deflect a plurality of electron beams from the corresponding multi-source module 1 to displace a plurality of electron source images in the X and Y directions on the wafer 4.

Reference numeral 5 denotes a stage which can move the wafer 4 placed thereon in the X and Y directions perpendicular to an optical axis AX (Z-axis) and in the rotation direction about the Z-axis. A stage reference plate 6 is fixed on the stage 5.

Reference numeral 7 denotes reflected electron detectors. The reflected electron detectors 7 detect reflected electrons generated when a mark on the stage reference plate 6 is irradiated with an electron beam.

Figure 4:
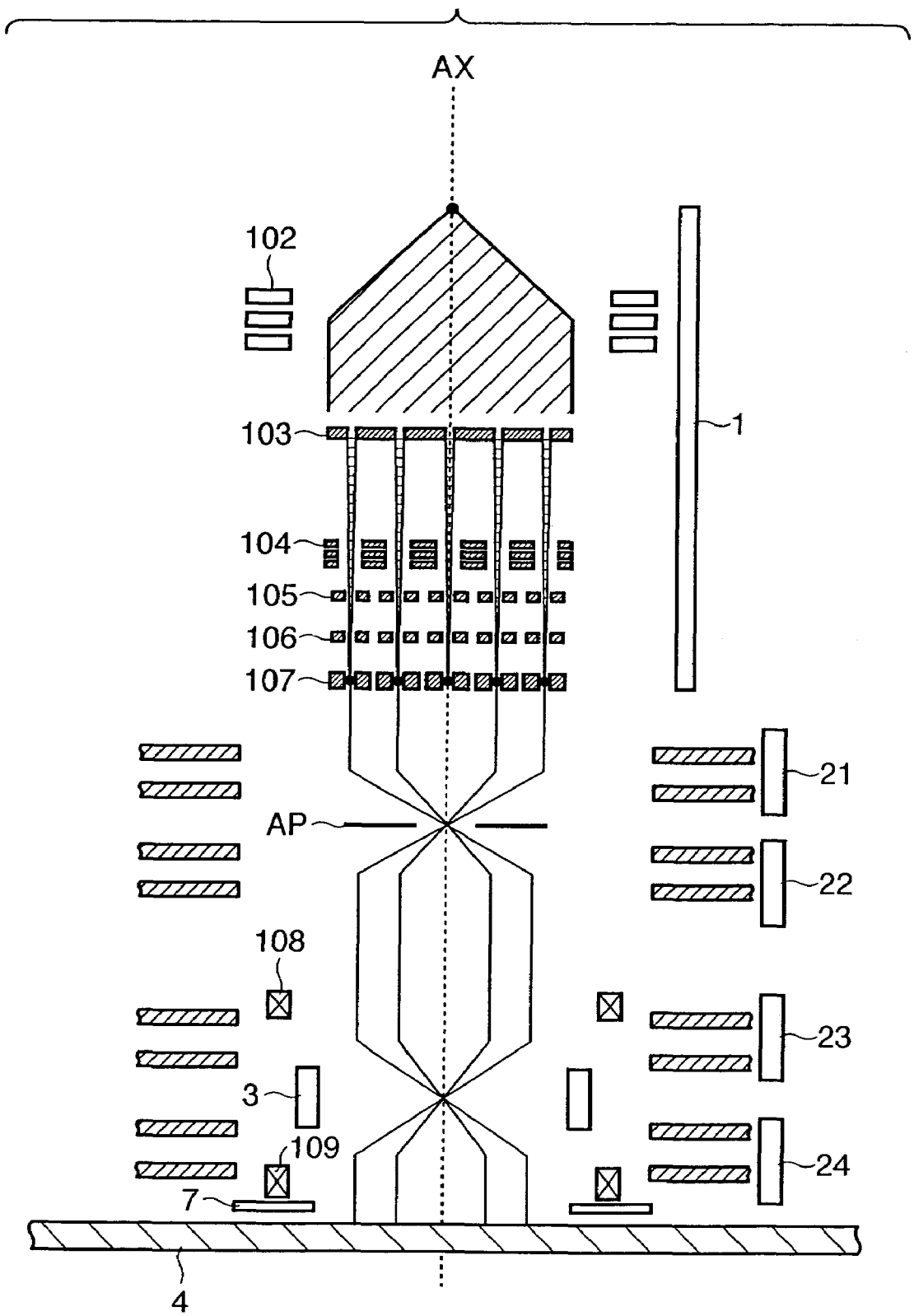
FIG. 4 is a view for explaining the electron optical system of each column of the apparatus in FIGS. 3A and 3B.

FIG. 4 is a view showing a detailed structure of one of the columns. The multi-source module 1 and a function of adjusting the optical characteristics of an electron beam, which comes incident from the multi-source module 1 to the wafer 4, will be described with reference to FIG. 4.

Reference numeral 101 denotes an electron source (crossover image) formed by an electron gun. An electron beam emitted from the electron source 101 becomes an almost parallel electron beam via a condenser lens 102. The condenser lens 102 of this embodiment is an electrostatic lens having three opening electrodes.

Reference numeral 103 denotes an aperture array having a plurality of openings two-dimensionally arrayed; 104, a lens array in which electrostatic lenses having the same optical power are two-dimensionally arrayed; 105 and 106, deflector arrays each formed by two-dimensionally arraying electrostatic eight-pole deflectors that can individually be driven; and 107, a blanker array formed by two-dimensionally arraying electrostatic blankers that are drivable individually. The multi-charged beam lens 100 according to the preferred embodiment of the present invention constitutes the lens array 104.

Figure 5:
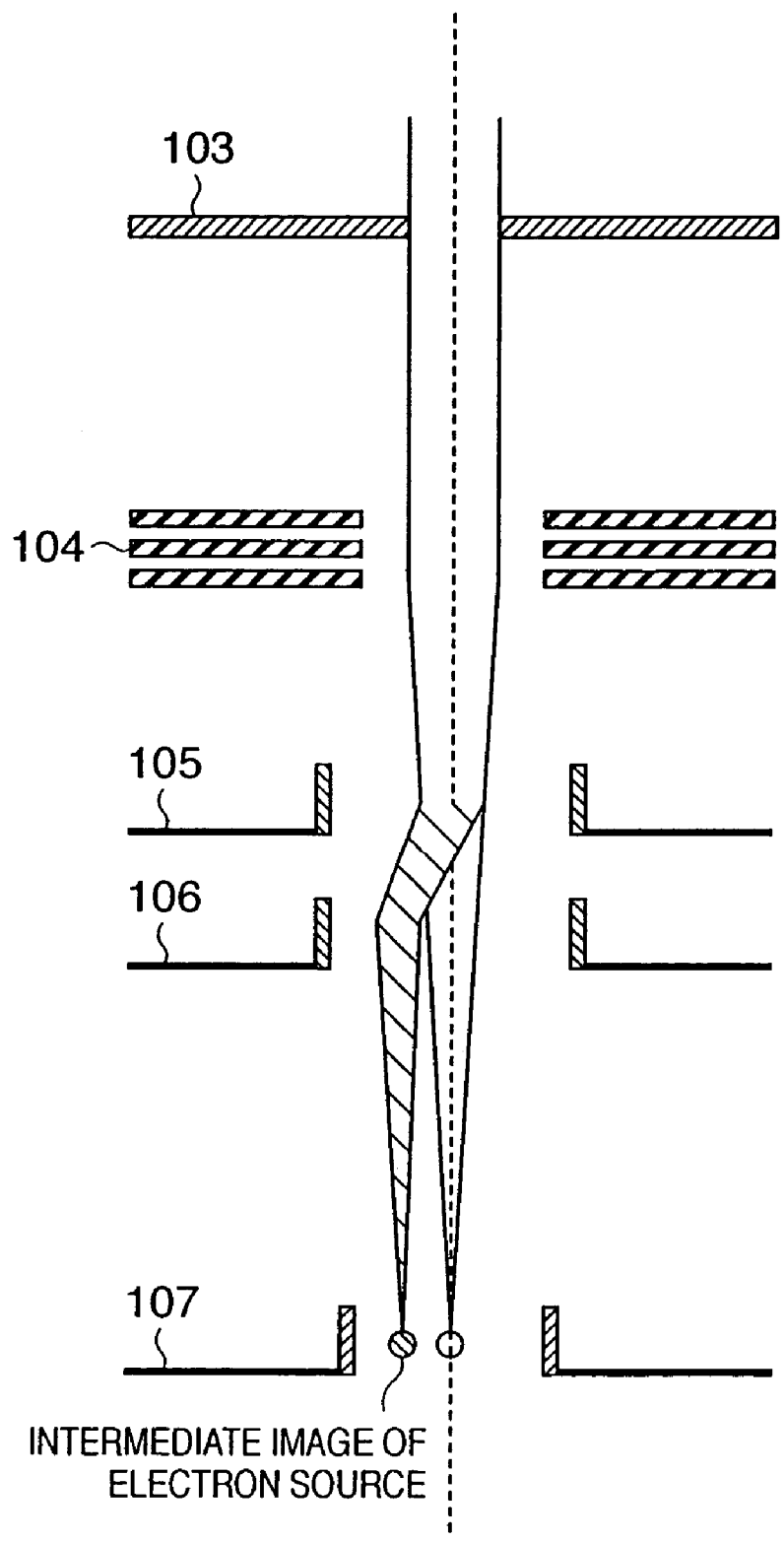
FIG. 5 is a view for explaining the function of each of multi-source modules of the apparatus in FIGS. 3A and 3B.

The functions will be described with reference to FIG. 5. The almost parallel electron beam from the condenser lens 102 (FIG. 4) is divided into a plurality of electron beams by the aperture array 103. Each obtained electron beam forms an electron source intermediate image on a corresponding blanker of the blanker array 107 via a corresponding electrostatic lens of the lens array 104.

In this state, the deflector arrays 105 and 106 individually adjust the positions (in the plane perpendicular to the optical axis) of the electron source intermediate images formed on the blanker array 107. An electron beam deflected by each blanker of the blanker array 107 is shielded by a blanking aperture AP in FIG. 4, so the wafer 4 is not irradiated with the electron beam. On the other hand, an electron beam which is not deflected by the blanker array 107 is not shielded by the blanking aperture AP, so the wafer 4 is irradiated with the electron beam.

Referring back to FIG. 4, the plurality of intermediate images of the electron sources formed in each multi-source module 1 are projected onto the wafer 4 via two corresponding magnetic lenses of the magnetic lens arrays 21 and 22.

Of the optical characteristics of each column when the plurality of intermediate images are projected onto the wafer 4, image rotation and magnification factor can be adjusted by the deflector arrays 105 and 106 which can adjust each intermediate image position on the blanker array. The focal position of each column can be adjusted by dynamic focus lenses (electrostatic or magnetic lenses) 108 and 109 arranged for each column.

Figure 6:
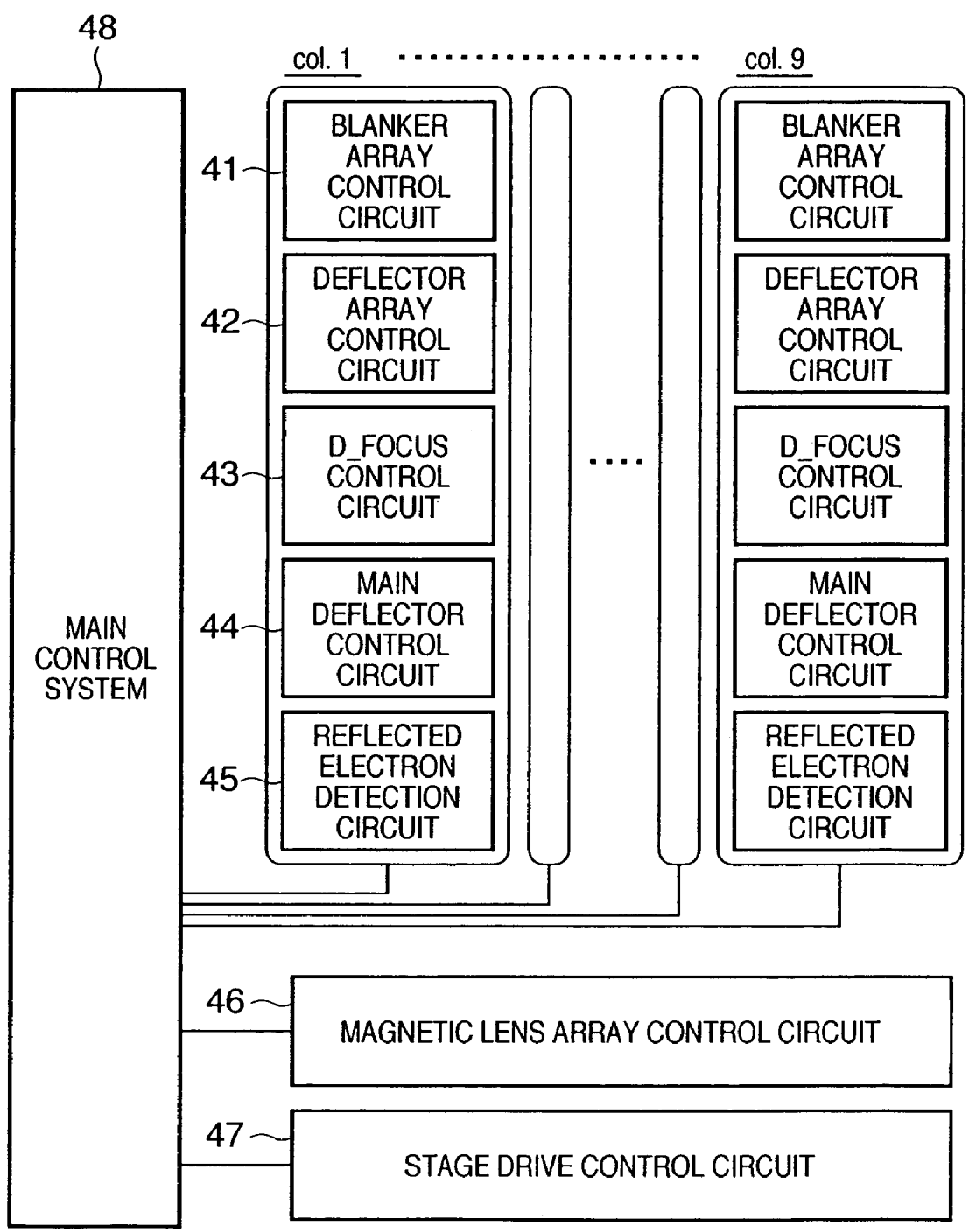
FIG. 6 is a diagram for explaining the arrangement of the electron beam exposure apparatus shown in FIGS. 3A and 3B.

FIG. 6 shows the system arrangement of this embodiment. In FIG. 6, a blanker array control circuit 41 individually controls the plurality of blankers that constitute the blanker array 107. A deflector arrays control circuit 42 individually controls the plurality of deflectors that constituted the deflector arrays 105 and 106. A D_FOCUS control circuit 43 individually controls the dynamic focus lenses 108 and 109. A main deflector control circuit 44 controls the main deflector 3. A reflected electron detection circuit 45 processes a signal from the reflected electron detector 7. The blanker array control circuits 41, deflector array control circuits 42, D_FOCUS control circuits 43, main deflector control circuits 44, and reflected electron detection circuits 45 are arranged equal in number to the column (col. 1 to col. 9).

A magnetic lens array control circuit 46 controls the common coils of the magnetic lens arrays 21, 22, 23 and 24. A stage drive control circuit 47 drive-controls the stage 5 in cooperation with a laser interferometer (not shown) which detects the position of the stage 5. A main control system 48 controls the plurality of control circuits and manages the entire electron beam exposure apparatus.

Second Embodiment

Figure 7:
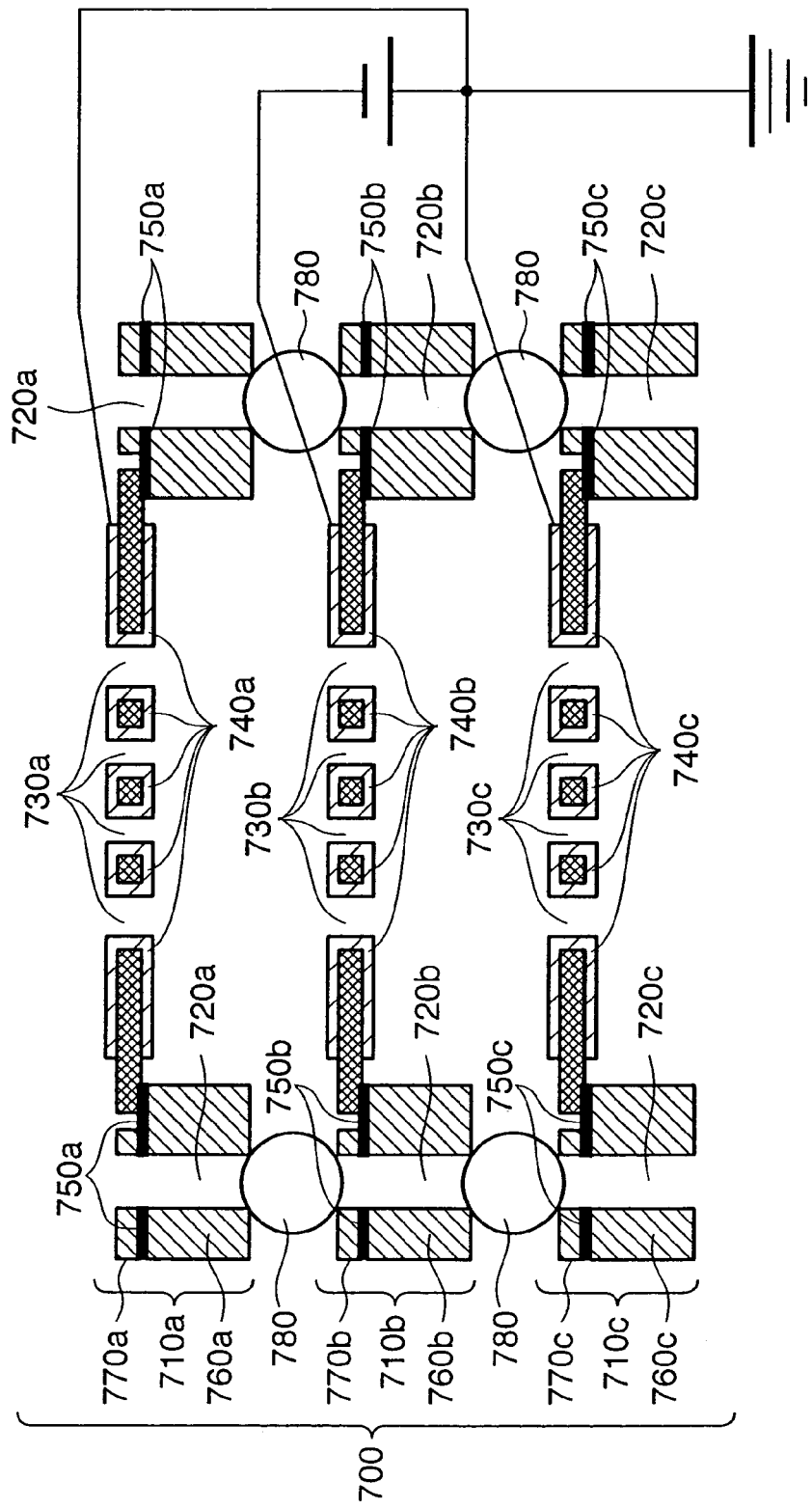
FIG. 7 is a view for explaining the structure of a multi-charged beam lens according to the second embodiment of the present invention.

This embodiment provides a concrete example in which a semiconductor portion coated with an insulating layer is in contact with an insulator. FIG. 7 is a sectional view schematically showing the structure of a multi-charged beam lens according to the second embodiment of the present invention.

A multi-charged beam lens 700 has a structure in which three electrode substrates 701a, 701b, and 701c are arranged via insulators 780. The three electrode substrates 710a, 710b, and 710c have lens apertures 730a, 730b, and 730c, voltage application portions 740a, 740b, and 740c, insulating portions 750a, 750b, and 750, assembly grooves 720a, 720b, and 720c, semiconductor portions 760a, 760b, and 760c, and insulating layers 770a, 770b, and 770c. The insulators 780 are interposed between the grooves 720a, 720b, and 720c, positioning the three electrode substrates 710a, 710b, and 710c.

As the material for the electrode substrates 710a to 710c, an SOI substrate is typically used. The grooves 720a to 720c do not always extend through the substrates, and their surfaces may partially be recessed. The voltage application portions 740a to 740c can be formed by various methods such as CVD and sputtering and can be formed with ease. It is preferable to use a noble metal as the material for the voltage application portions 740a to 740c. This is because the noble metal resists oxidation and can last for a long time. The insulating portions 750a to 750c can be formed as buried insulating films for the electrode substrates 710a to 710c. The shape of each insulator 760 is not limited to any specific one. To easily assemble the multi-charged beam lens while positioning it at high precision, the shape is preferably cylindrical.

In this embodiment, out of the voltage application portion 740a of the upper electrode substrate, the voltage application portion 740b of the intermediate electrode substrate, and the voltage application portion 740c of the lower electrode substrate, the upper electrode substrate voltage application portion 740a and the lower electrodes substrate voltage application portion 740c receive the same potential and are typically grounded.

At this time, portions (in this case, the edge portions of the grooves 720a, 720b, and 720c) where the electrode substrates are in contact with the insulators 780 between the electrode substrates and the voltage application portions 740a, 740b, and 740c serving as electrodes are separated from each other via the insulating portions 750a, 750b, and 750c, semiconductor portions 760a, 760b, and 760c, and insulating layers 770a, 770b, and 770c. Accordingly surface discharge, which may occur on the surface of each insulator 80, can be reduced.

As shown in FIG. 7, the voltage application portion 740b of the intermediate electrode substrate typically receives a negative potential with respect to the potential of the voltage application portion 740a of the upper electrode substrate and the voltage application portion 740c of the lower electrode substrate. However, the voltage application portion 740b may receive a positive potential.

In this embodiment, the multi-charged beam lens 700 comprises three electrode substrates. However, the number of electrode substrates is not limited to three and can arbitrarily be set.

An example of a method of fabricating the electrode substrates 710a, 701b, and 701c shown in FIG. 7 will be described with reference to FIGS. 8A to 8H. In the step shown in FIG. 8A, an SOI wafer 800 including silicon wafers 801 and 803, and a silicon dioxide layer 802 is prepared. In the step shown in FIG. 8B, a resist is applied by spin coating or the like. After that, the resist is patterned in the exposure and developing steps, forming a mask 804. In the step shown in FIG. 8C, lens apertures 830 and an assembly groove 821 are formed in the silicon layer 801 by dry etching (anisotropic etching) using etching gas such as $SF_6$ gas. Thereafter, the mask 804 is removed. In the step shown in FIG. 8D, a resist is applied to the lower side of the silicon layer 803 by spin coating or the like. In the exposure and developing steps, the resist is patterned while being aligned with the pattern on the upper side, forming a mask 805.

Figure 8A:
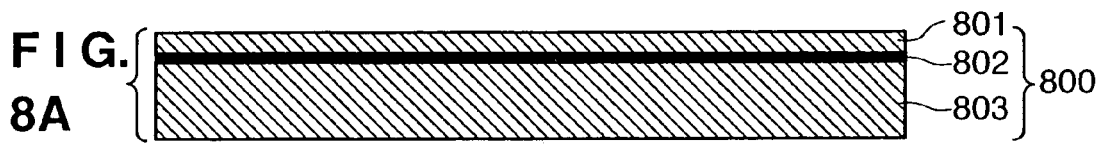
FIGS. 8A to 8H are views for explaining a method of fabricating each of electrode substrates which constitute the multi-charged beam lens in FIG. 7.
Figure 8B:
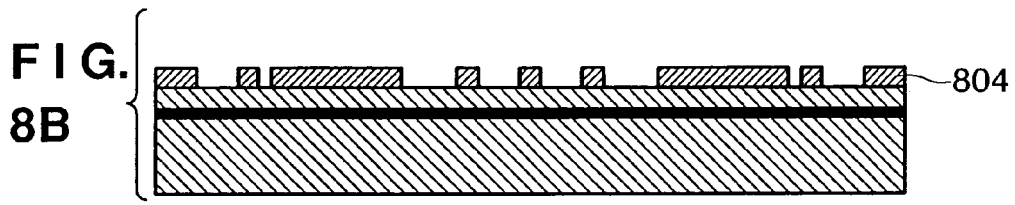
Figure 8C:
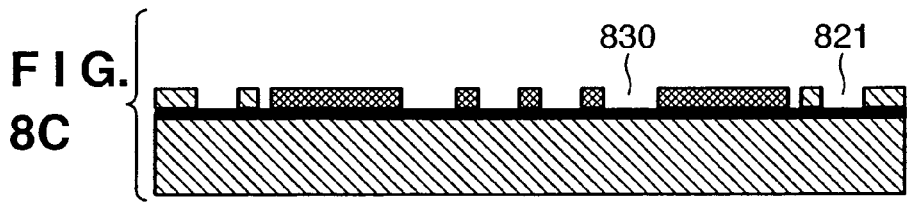
Figure 8D:
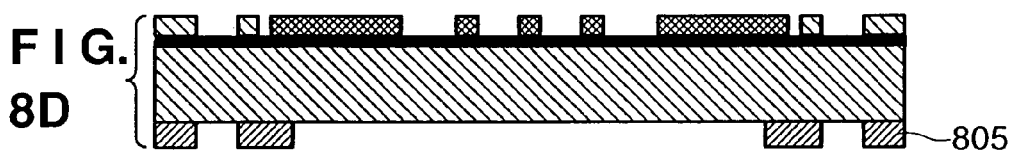
Figure 8E:
Figure 8F:
Figure 8G:
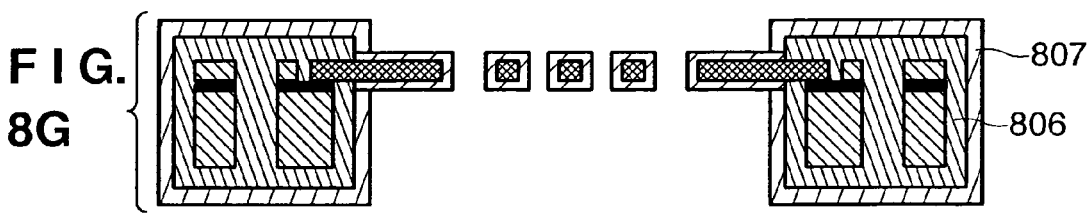
Figure 8H:
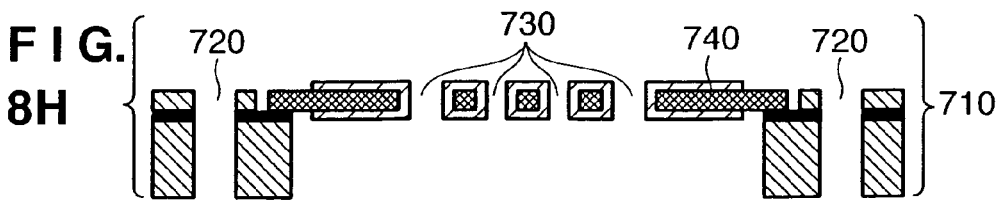

In the step shown in FIG. 8E, an assembly groove 822 is formed in the silicon layer 803 by dry etching (anisotropic etching) using etching gas such as $SF_6$ gas. The mask 805 is removed. Thereafter, in the step shown in FIG. 8F, exposed portions of the silicon dioxide layer 802 are removed by wet etching using hydrofluoric acid or the like, and the silicon surface is oxidized by thermal oxidation. With this operation, an insulating layer 870, which covers a semiconductor portion 860, is formed. In the step shown in FIG. 8G, a resist is applied by spin coating or the like. The resist is patterned in the exposure and developing steps, forming a sacrificial layer 806. After that, a conductive material is sputtered onto the upper and lower surfaces, forming a conductive film 807. As the conductive material for the conductive film, a metal is preferably used. A noble metal which resists oxidation is more preferable, and gold is most preferable. In the step shown in FIG. 8H, ultrasonic cleaning is performed in an organic solvent to remove the sacrificial layer 806 and conductive film 807 thereon. A voltage application portion 740 is formed, and an electrode substrate 710 can be obtained.

The insulator 780 (FIG. 7) is arranged in an assembly groove 720 of the electrode substrate 710 obtained in the above-mentioned steps. Another electrode substrate 710 is stacked thereon. In this manner, the multi-charged beam lens 700 shown in FIG. 7 can be obtained.

If the multi-charged beam lens is constituted by three or more electrode substrates as well, the multi-charged beam lens can be fabricated by using the same method as described above.

In the schematic sectional view shown in FIG. 7, four electron lenses each comprising the four lens apertures 730a, 730b, or 730c are illustrated. Electron lenses can be arranged in accordance with a one- or two-dimensional design specification. In a typical multi-charged beam lens, several hundred or several thousand electron lenses can be two-dimensionally arranged.

In this embodiment, the thickness of the voltage application portions 740a, 740b, and 740c can be reduced while keeping their structural strength to some extent. Since the aspect ratio of the apertures 730a, 730b, and 730c can be reduced, a multi-charged beam lens, which is easier to manufacture, can obtained.

The multi-charged beam lens described can also be applied to a charged beam exposure apparatus such as an electron beam exposure apparatus illustrated in FIGS. 3A and 3B. A charged beam exposure apparatus of this type is preferably used to manufacture a device such as a semiconductor device.

According to the above-mentioned embodiments, voltage application portions and portions of electrode substrates that are in contact with insulators interposed between the electrode substrates are separated from each other via insulating portions. The triple point of the boundary between each insulator, vacuum region, and electrode is reduced or eliminated. Surface discharge which may occur on the surface of each insulator can be reduced without any back electrode arrangement. According to the above-mentioned embodiments, there can be provided a multi-charged beam lens with a high breakdown voltage, high performance, and high reliability. Use of the multi-charged beam lens in a charged beam exposure apparatus makes it possible to provide a reliable exposure apparatus.

(Device Manufacturing Method)

An application example of a device manufacturing method using the above-mentioned electron beam exposure apparatus will be described next.

Figure 9:
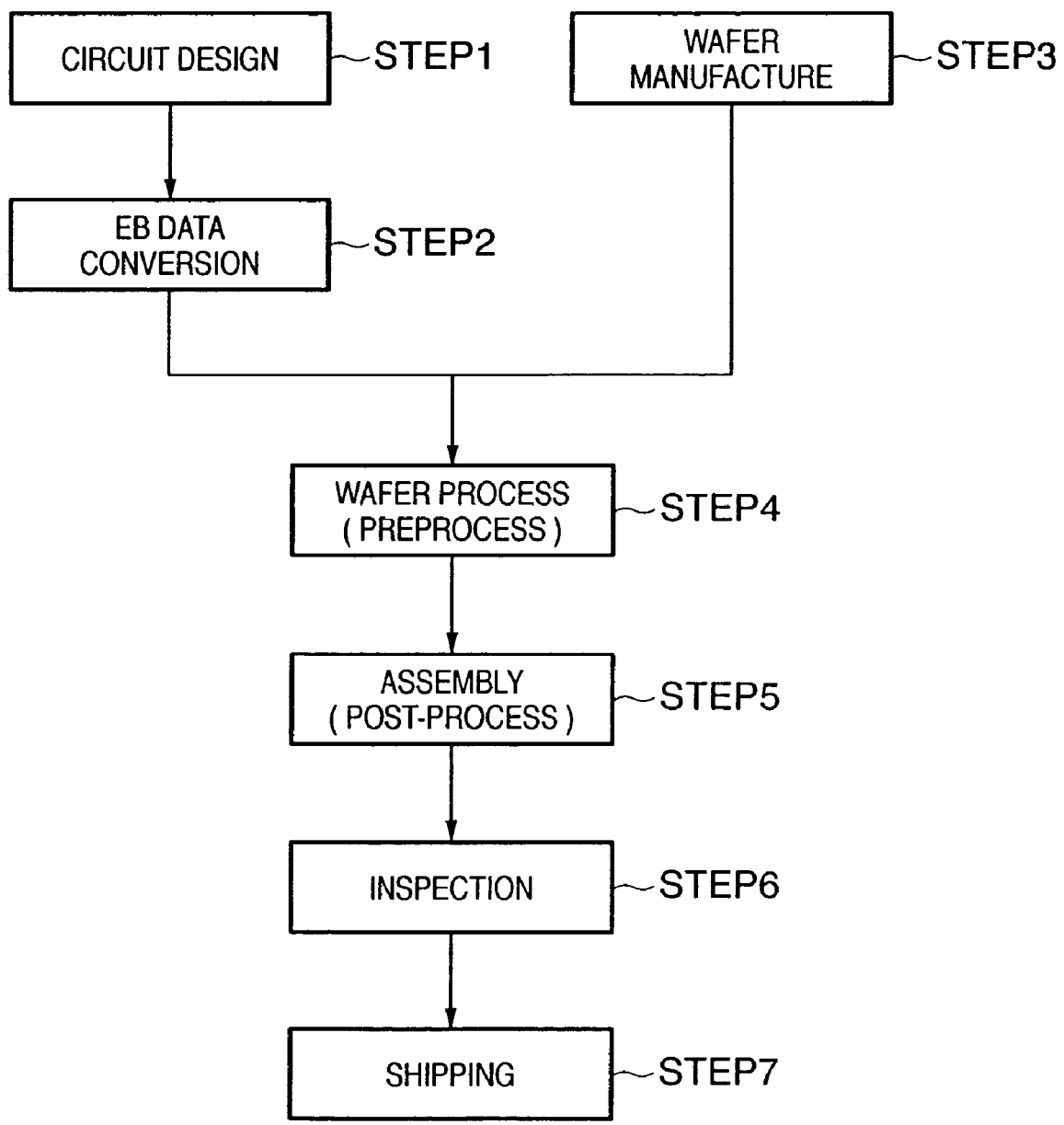
FIG. 9 is a flowchart for explaining the flow of the manufacturing process of a device.

FIG. 9 shows the manufacturing flow of a microdevice (e.g., a semiconductor chip such as an IC or LSI, a liquid crystal panel, a CCD, a thin-film magnetic head, a micromachine, or the like). In step 1 (circuit design), a semiconductor device circuit is designed. In step 2 (EB data conversion), the exposure control data for an exposure apparatus is created on the basis of the designed circuit pattern. In step 3 (wafer manufacture), a wafer is manufactured by using a material such as silicon. In step 4 (wafer process), called a preprocess, an actual circuit is formed on the wafer by lithography using the wafer and the exposure apparatus into which the prepared exposure control data is input. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test of the semiconductor device manufactured in step 5. After these steps, the semiconductor device is completed and shipped (step 7).

Figure 10:
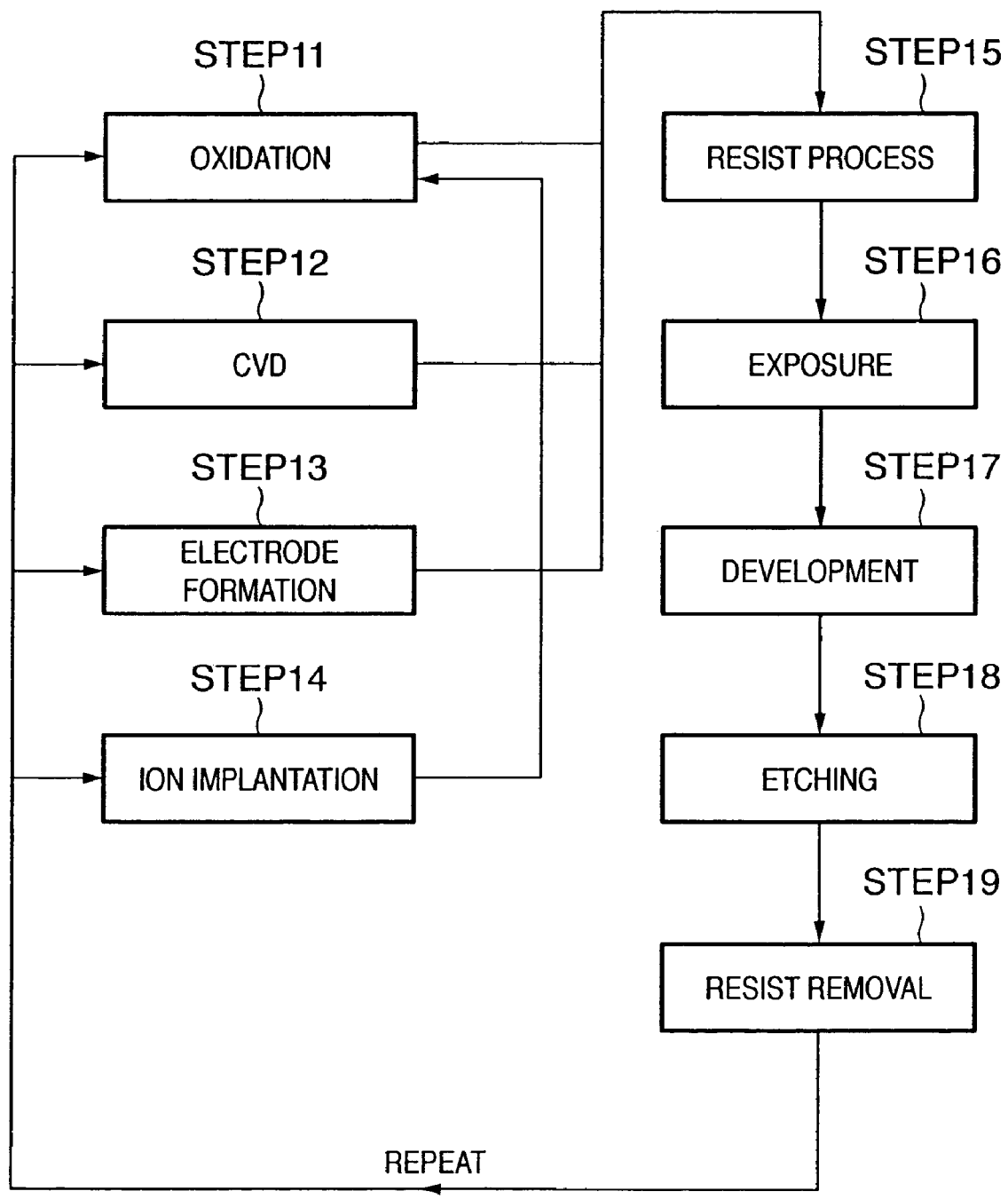
FIG. 10 is a flowchart for explaining the wafer process in FIG. 9.

FIG. 10 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer using the above-mentioned exposure apparatus. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

The manufacturing method of the application example makes it possible to manufacture, at low cost, a highly-integrated microdevice which has conventionally been hard to manufacture.

As many apparently widely different embodiments of the present invention can be made without departing from the spirit and scope thereof, it is to be understood that the invention is not limited to the specific embodiments thereof except as defined in the appended claims.

What is claimed is:

1. A multi-charged beam lens formed by stacking via insulators at least three substrates each having a plurality of apertures which pass charged beams, the lens comprising:
 a voltage application portion arranged on at least one of the at least three substrates,
  wherein said voltage application portion and the insulators are connected via an insulating portion consisting of an oxide material in order to achieve electrical isolation between said voltage application portion and the insulators.

2. The lens according to claim 1, wherein the portion of the substrate that is in contact with the insulator is the insulating portion.

3. The lens according to claim 1, wherein the at least one substrate further comprises a semiconductor portion insulated from the voltage application portion, and the semiconductor portion is in contact with the insulator.

4. The lens according to claim 3, wherein the semiconductor portion is coated with an insulating layer.

5. The lens according to claim 1, wherein the voltage application portion is formed by forming a conductive film on the substrate.

6. The lens according to claim 5, wherein the conductive film is made of a noble metal.

7. The lens according to claim 1, wherein the insulating portion is made of silicon dioxide.

8. The lens according to claim 1, wherein a material for the substrate is one of a conductor and a semiconductor.

9. The lens according to claim 1, wherein each of the at least three electrode substrates has an alignment recessed portion in a surface in contact with the insulator, and the insulator is arranged in the recessed portion.

10. The lens according to claim 9, wherein the recessed portion is shaped into a groove.

11. The lens according to claim 1, wherein the insulator is shaped into a cylinder.

12. A charged beam exposure apparatus which exposes a substrate to be exposed using a charged beam, the apparatus comprising:
 a charged beam source which emits a charged beam;
 a first electron optical system which forms a plurality of intermediate images of said charged beam source;
 a second electron optical system which projects the plurality of intermediate images formed by said first electron optical system onto a substrate to be exposed; and
 an alignment apparatus which holds and drives the substrate to be exposed to a predetermined position, and aligns the substrate,
 wherein said first electron optical system uses a multi-charged beam lens formed by stacking via insulators at least three substrates each having a plurality of apertures which pass charged beams, and the multi-charged beam lens has a voltage application portion arranged on at least one of the at least three substrates and the voltage application portion and the insulators are connected via an insulating portion consisting of an oxide material in order to achieve electrical isolation between the voltage application portion and the insulators.

13. A device manufacturing method, comprising:
 an exposure step of exposing a substrate to be exposed to a pattern using a charged beam exposure apparatus as defined in claim 12; and
 a development step of developing the substrate which has been exposed to the pattern in the exposure step.

14. An electrostatic lens for a charged beam, the lens comprising:
 a plurality of substrates each having at least one aperture; and
 spacers arranged between said plurality of substrates,
 wherein at least one of said plurality of substrates has an electrode portion which controls a trajectory of the charged beam passing through the aperture and the voltage application portion and the insulators are connected via an insulating portion consisting of an oxide material in order to achieve electrical isolation between the voltage application portion and the insulators.

15. A charged beam exposure apparatus, comprising:
a charged beam source; and
an electrostatic lens, the electrostatic lens having a plurality of substrates each having at least one aperture and spaces arranged between the plurality of substrates, wherein at least one of the plurality of substrates has an electrode portion for controlling a trajectory of the charged beam passing through the aperture and the voltage application portion and the insulators are connected via an insulating portion consisting of an oxide material in order to achieve electrical isolation between the voltage application portion and the insulators.

16. A device manufacturing method, comprising:
an exposure step of exposing a substrate to be exposed to a pattern using a charged beam exposure apparatus as defined in claim 15; and
a development step of developing the substrate which has been exposed to the pattern in the exposure step.

* * * * *